(12) United States Patent
Gil et al.

(10) Patent No.: US 7,348,104 B2
(45) Date of Patent: Mar. 25, 2008

(54) SYSTEM AND METHOD FOR FABRICATION AND REPLICATION OF DIFFRACTIVE OPTICAL ELEMENTS FOR MASKLESS LITHOGRAPHY

(75) Inventors: Dario Gil, Cambridge, MA (US); Jeffrey T. Hastings, Cambridge, MA (US); James G. Goodberlet, Melrose, MA (US); Rajesh Menon, Boston, MA (US); David J. Carter, Cambridge, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 332 days.

(21) Appl. No.: 10/677,173

(22) Filed: Oct. 2, 2003

(65) Prior Publication Data
US 2004/0131946 A1 Jul. 8, 2004

Related U.S. Application Data

(60) Provisional application No. 60/415,720, filed on Oct. 3, 2002.

(51) Int. Cl.
G02B 27/44 (2006.01)
G02B 27/42 (2006.01)
G02B 5/18 (2006.01)

(52) U.S. Cl. .................... 430/4; 430/11; 430/394; 359/558; 359/565; 359/573

(58) Field of Classification Search ............... None
See application file for complete search history.

(56) References Cited

U.S. PATENT DOCUMENTS

| | | | |
|---|---|---|---|
| 5,218,471 A * | 6/1993 | Swanson et al. | 359/565 |
| 5,549,934 A | 8/1996 | Garza et al. | |
| 5,794,023 A * | 8/1998 | Hobbs et al. | 359/565 |
| 5,900,637 A | 5/1999 | Smith | |
| 6,410,213 B1 | 6/2002 | Raguin et al. | |
| 2002/0019305 A1 | 2/2002 | Wu | |
| 2004/0069957 A1* | 4/2004 | Menon et al. | 250/492.2 |
| 2005/0032378 A1* | 2/2005 | Yu et al. | 438/689 |

FOREIGN PATENT DOCUMENTS

GB   2 132 879   7/1984

OTHER PUBLICATIONS

"Hydrogen silsesquioxane/novolak bilayer resist for high aspect ratio nanoscale electron-beam lithography," Falco et al. *J. VAc. Sci. Technol. B.*, Nov./Dec. 2000.
"Low energy lithography; energy control and variable energy exposure," Brunger et al. *Microelectric Engineering*. 1995. vol. 27.
H. Namatsu, "Supercritical resist drying for isolated nanoline formation," J. Vac. Sci. Technol. B 19(6), Nov./Dec. 2001, pp. 2709-2712.
H. Namatsu et al., "Three-dimensional siloxane resist for the formation of nanopatterns with minimum linewidth fluctuations," J. Vac. Sci. Technol. B 16(1), Jan./Feb. 1998, pp. 69-76.
F. van Delft et al., "Hydrogen silsesquioxane/novolak bilayer resist for high aspect ratio nanoscale electron-beam lithography," J. Vac. Sci. Technol. B 18(6), Nov./Dec. 2000, pp. 3419-3423.
B. Harkness et al., "Demonstration of a Directly Photopatternable Spin-On-Gladd Based on Hydrogen Silsesquioxane and Photobase Generators," Macromolecules 1998, vol. 31, pp. 4798-4805.
H. Namatsu et al., "Nano-Patterning of a Hydrogen Sisesquioxane Resist with Reduced Linewidth Fluctuations," Microelectronic Engineering, vol. 41/42, 1998, pp. 331-334.
T.A. Fulton et al., "New approach to electron beam lithography," Appl. Phys. Lett., vol. 42, No. 8, Apr. 15, 1983, pp. 752-754.
G.J. Dolan et al., "Canyon Lithography," IEEE Electron Device Letters, vol. EDL-4, No. 6, Jun. 1983, pp. 178-180.
W. Chan, "Maskless, selective electroetching for metal patterning," J. Appl. Phys., vol. 58, No. 4, Aug. 15, 1985, pp. 1704-1705.

* cited by examiner

*Primary Examiner*—Mark F. Huff
*Assistant Examiner*—Daborah Chacko-Davis
(74) *Attorney, Agent, or Firm*—Gauthier & Connors LLP

(57) ABSTRACT

A method is disclosed for forming an array of focusing elements for use in a lithography system. The method involves varying an exposure characteristic over an area to create a focusing element that varies in thickness in certain embodiments. In further embodiments, the method includes the steps of providing a first pattern via lithography in a substrate, depositing a conductive absorber material on the substrate, applying an electrical potential to at least a first portion of the conductive absorber material, leaving a second portion of the conductive material without the electrical potential, and etching the second portion of the conductive material to provide a first pattern on the substrate that is aligned with the first portion of the conductive absorber material.

20 Claims, 14 Drawing Sheets

Cylindrical Lens

SYSTEM AND METHOD FOR FABRICATION AND REPLICATION OF DIFFRACTIVE OPTICAL ELEMENTS FOR MASKLESS LITHOGRAPHY

PRIORITY

This application claims priority to U.S. Provisional Application Ser. No. 60/415,720 filed Oct. 3, 2002. This invention was made with support from the United States government under Grant No. DAAD19-01-1-0330, and the United States government has certain rights to the invention.

BACKGROUND OF THE INVENTION

The invention relates to maskless lithography, and relates in particular to maskless lithography using arrays of focusing elements.

U.S. Pat. No. 5,900,637 discloses a system for maskless lithography that involves the focusing of incident energy from a single energy source onto a substrate as focused beamlets. The arrangement includes micro-mechanical devices with actuatable shutters that turn the focused beams on and off in response to commands from a control computer. To write a pattern, the substrate is scanned under the array, while the individual beams are turned on and off as needed by means of the micro-mechanical shutters, one associated with each zone plate. These shutters are disclosed to be located either between the zone plate array and the substrate, or between the zone plate array and the source of radiation. The '637 patent also discloses a lithography system that includes an array of micro-mechanical, deflectable glancing-angle mirrors that may be used to turn individual focused beams on and off.

Such lithography systems, however, require that zone plate arrays be very precise and uniform without significant variation. Diffractive elements such as zone plates may be formed using step approximation, which requires aligned lithography and an etch for each level of stepping in forming the diffractive elements. Other diffractive elements may be formed by 3D patterning in which grayscale resist exposures are used, or using a low selectivity reactive ion-etching step. In certain applications, however, the use of individually created zones on zone plates may not be appropriate.

For example, a conventional process for fabricating UV and DUV zone plates typically involves defining the area where the diffractive optics would be placed in subsequent steps. Chromium (Cr) is used as the absorber material in this process, but a number of other materials may also be employed. The diffractive optics are then defined, and the resist patterns are then transferred into the fused silica substrate by means of reactive-ion-etching. This and other conventional fabrication procedures requiring multilevel alignment are difficult to generalize to create very large arrays with commercial high-throughput electron-beam-lithography systems. The chief problem arises from the fact that commercial mask makers (both electron-beam-lithography and laser based systems), the only systems with sufficient throughput to write large arrays, are not set-up for multi-level alignment.

There remains a need therefore, for an improved method of forming arrays of zone plates or other diffractive elements for a maskless lithography system.

SUMMARY OF THE INVENTION

The invention provides a method for forming an array of focusing elements for use in a lithography system. The method involves varying an exposure characteristic over an area of a substrate during lithography to provide focusing elements of varying thickness in certain embodiments. The substrate may include hydrogen silsesquioxane, and the thereby formed focusing elements may be formed of $SiO_2$ and may vary in thickness to provide blazed Fresnel zone plates in accordance with certain embodiments.

In accordance with a further embodiment, the method includes the steps of providing a first pattern via lithography in a substrate, depositing a conductive absorber material on the substrate, applying an electrical potential to at least a first portion of the conductive absorber material, leaving a second portion of the conductive material without the electrical potential, and etching the second portion of the conductive material to provide a first pattern on the substrate that is aligned with the first portion of the conductive absorber material. In further embodiments, the substrate may be formed of hydrogen silsesquioxane, the first pattern may be formed by electron beam lithography and the conductive absorber material may include chromium. In further embodiments, the first pattern may include an array of focusing elements for use in a lithography system.

BRIEF DESCRIPTION OF THE DRAWINGS

The following description may be further understood with reference to the accompanying drawings in which.

The drawings are shown for illustrative purposes and are not to scale.

DETAILED DESCRIPTION OF THE ILLUSTRATED EMBODIMENTS

Systems and methods in accordance with different embodiments of the invention may be used to form arrays of a variety of focusing elements, such as arrays Fresnel zone plates. In various embodiments, the system provides for the fabrication of binary and blazed phase diffractive optical elements using electron-beam lithography and the negative resist hydrogen silsesquioxane (HSQ) or the use of a method for self-aligned selective chemical etching (e.g., BrushFire lithography) for the fabrication of diffractive optical elements.

In certain embodiments, processes of the invention provide for fabricating binary and blazed phase diffractive optical elements that are capable of achieving high-resolution using only a single lithography step with no etching (even for the case of phase plates). This technique requires the use of the negative resist HSQ (hydrogen silsesquioxane, manufactured by Dow Corning Corporation of Midland, Mich.), which is sensitive at both e-beam and x-ray wavelengths. The technique disclosed herein bypasses conventional approaches for blazed structures requiring multilevel alignments or reactive-ion-etching transfer schemes.

Although HSQ is not a very sensitive resist for e-beam lithography, its resolution and its glass-like properties make it an optimal choice for fabricating diffractive optical elements that operate at the UV and DUV regime. With an index of refraction very close to that of fused silica, and a negligible absorption down to 157 nm, it is possible to fabricate zone plates and other phase diffractive optical elements in one lithography step without the need for etching. Once the resist is spun to the proper thickness so as to provide the desired phase step for the optic, patterning and development are the only required steps.

Moreover, because in e-beam lithography the dose delivered to each pixel may be controlled, by employing a resist with the appropriate characteristics, it is possible to create three-dimensional profiles in one step without the need for multilevel alignment. This permits the possibility of fabricating blazed diffractive optics that may have efficiencies into the first order in excess of 80%.

Figure 1:
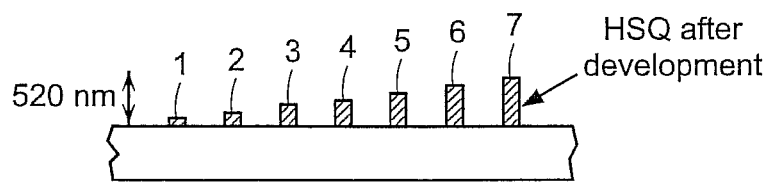
FIG. 1 shows an illustrative diagrammatic schematic view of the use of different exposure criteria using hydrogen silsesquioxane (HSQ) to form arrays of diffractive elements in accordance with an embodiment of the invention.
Figure 2:
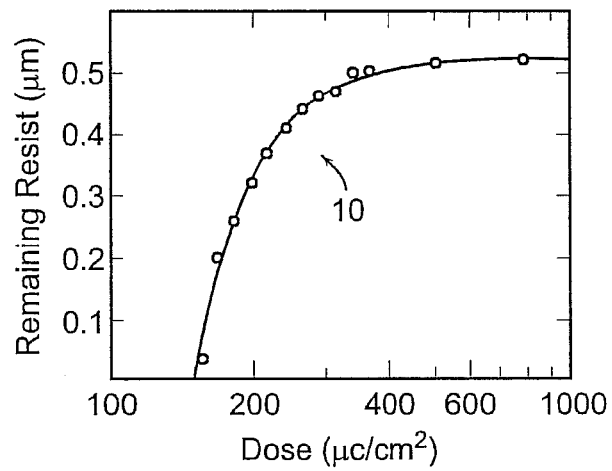
FIG. 2 shows an illustrative diagrammatic graphical view of the changes in the thickness of a resist as a result of change in dose delivered by an electron beam to form arrays of diffractive elements in accordance with an embodiment of the invention.
Figure 3:
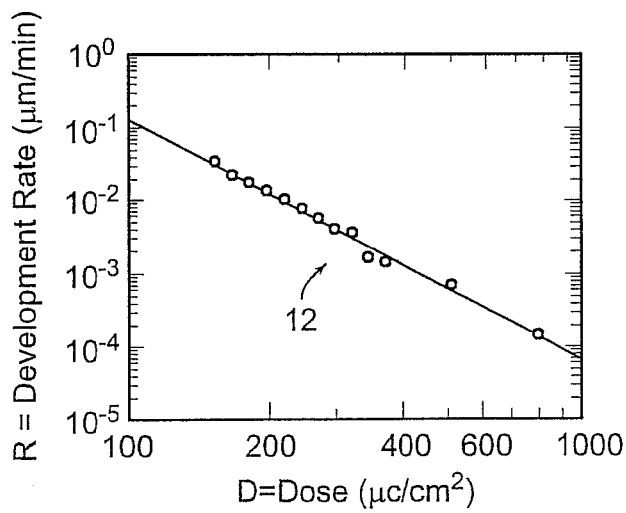
FIG. 3 shows an illustrative diagrammatic graphical view of the rate of development versus the dose delivered in a system using HSQ to form arrays of diffractive elements in accordance with an embodiment of the invention.

Processes of the invention permit the use of HSQ to pattern three-dimensional structures. For a given initial thickness of HSQ, the thickness remaining depends on the electron beam dose, as is depicted schematically in FIG. 1 in which the remaining thickness of dose 1 is shown at 1, dose 2 is shown at 2, dose 3 is shown at 3, dose 4 is shown at 4, dose 5 is shown at 5, dose 6 is shown at 6, and dose 7 is shown at 7, each having a higher dose and providing greater thickness of deposit. FIG. 2 shows a relationship 10 of the thickness of remaining resist after development versus dose delivered. FIG. 3 shows a relationship 12 between the rate of development versus dose delivered. The thickness, therefore, of the remaining HSQ material after development may be controlled using, for example, an exposure voltage of 30 kV, development time of 15 min., and a Shipley CD-26 developer.

Figure 4:
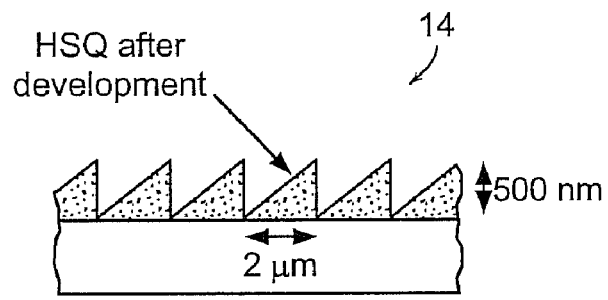
FIG. 4 shows an illustrative diagrammatic side view of a portion of an array of diffractive elements in accordance with an embodiment of the invention.
Figure 5:
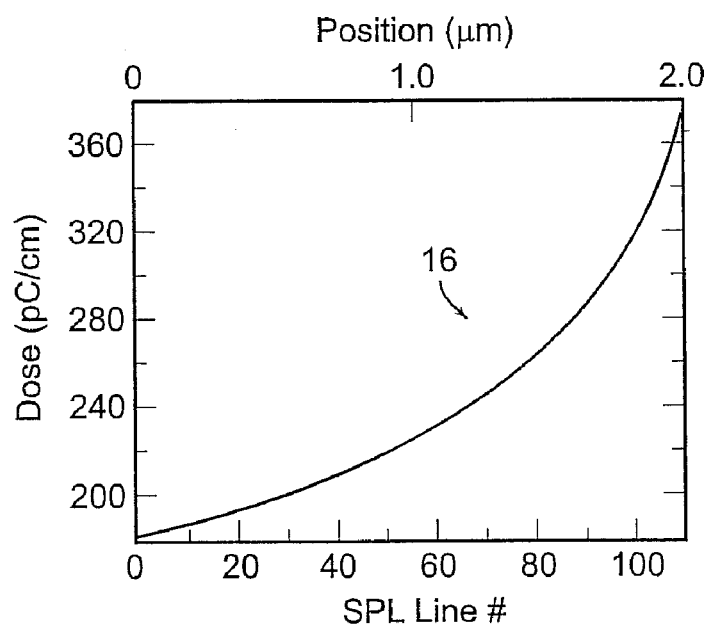
FIG. 5 shows an illustrative diagrammatic graphical view of a dose required across each blazed portion of the grating shown in FIG. 4 in order to achieve a linear slope for each blazed portion of the grating.

By knowing the dose necessary to achieve a certain thickness of resist after development, it is possible to fabricate sloped and other three-dimensional structures, such as the one shown at 14 in FIG. 4. FIG. 5 shows at 16 a relationship between the dose required across each tooth of the blazed grating in FIG. 4 to achieve a linear slope. Note that the dose required for a linear slope may not be a linear function.

Figure 6A:
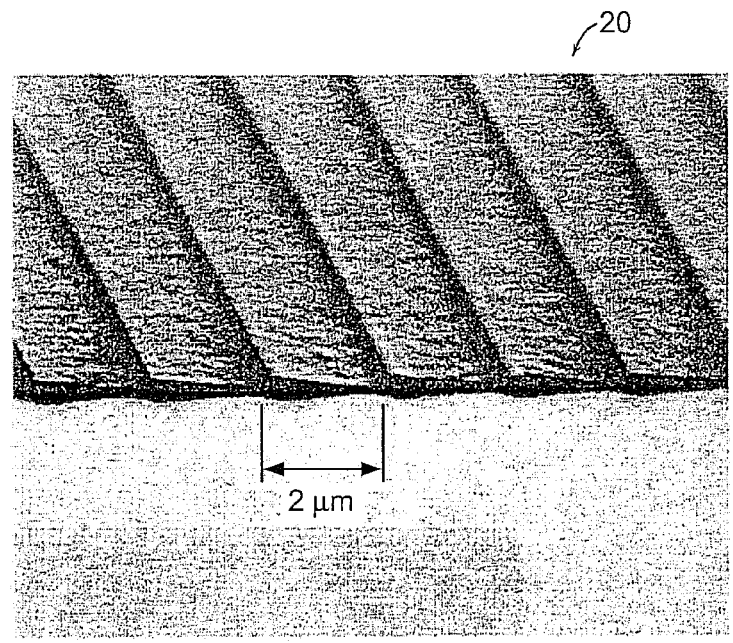
FIGS. 6A-6C show illustrative scanning electron micrographs of blazed structures fabricated using HSQ.
Figure 6B:
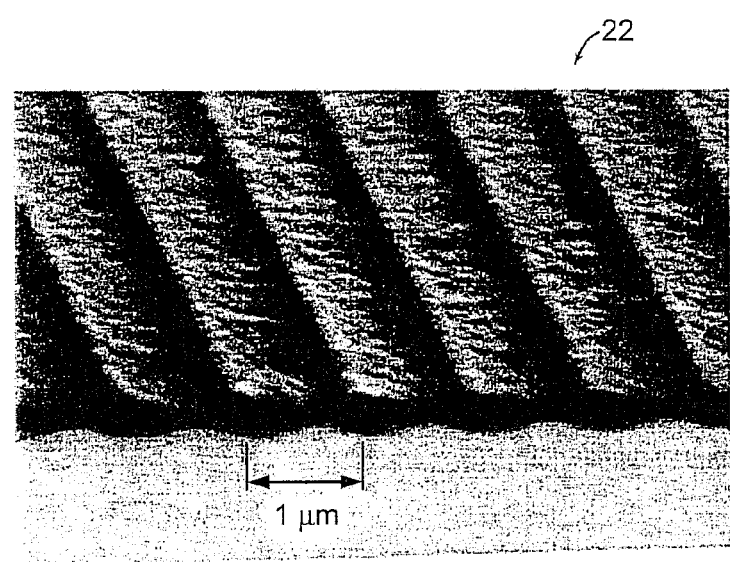
Figure 6C:
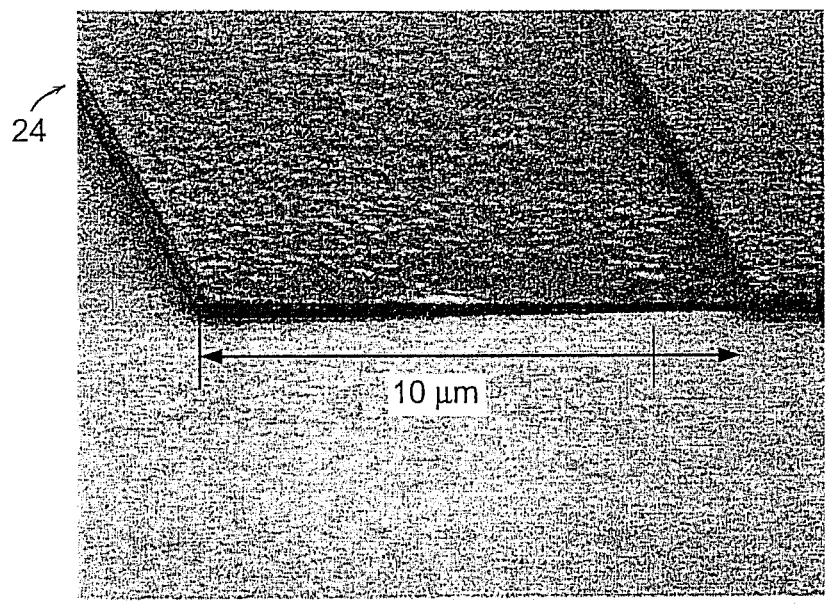
Figure 6D:
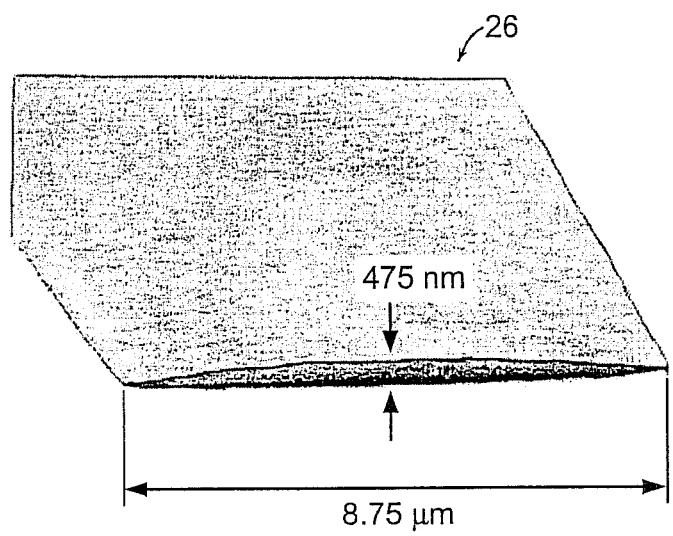
FIG. 6D shows an illustrative scanning electron micrograph of a cylindrical lens fabricated using HSQ.

FIGS. 6A-6C show scanning electron micrographs of blazed structures 20, 22 and 24 respectively fabricated with HSQ. Note that it is possible with this process to fabricate both linearly sloped structures 20, 22 and 24 as well as more complicated forms, such as the cylindrical lens 26 shown in FIG. 6D.

Apodization may also be applied to diffractive elements in lithographic systems of the invention. The utilization of the incident radiation across the diameter of the diffractive focusing element may be varied gradually as a function of radial distance so as to suppress the sidelobes or secondary maxima. The effect of apodization is to suppress the sidelobes or secondary maxima of the focus, as is known in the art. Apodization of a Fresnel zone plate causes a suppression of the sidelobes at the expense of a somewhat wider focal spot.

Figure 7A:
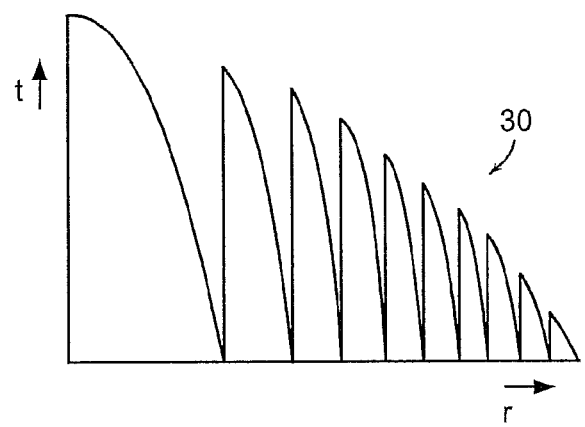
FIGS. 7A-7C show illustrative diagrammatic views of Fresnel zone plates for use in arrays of focusing elements in accordance with further embodiments of the invention.
Figure 7B:
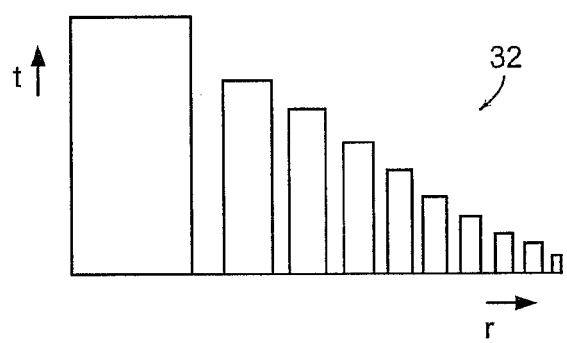
Figure 7C:
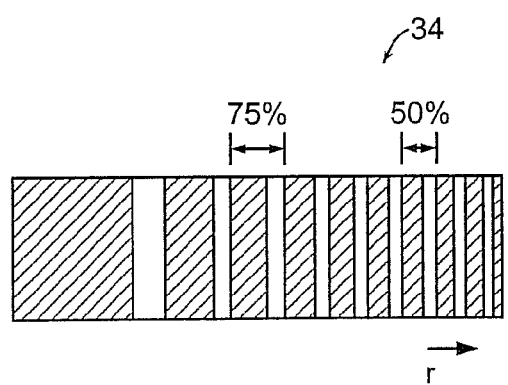

As generally shown in FIG. 7A, apodization of a blazed Fresnel zone plate 30 may be achieved by reducing the relative thicknesses of the blazed Fresnel zones in the radially outward direction. Apodization of a phase Fresnel zone plate may also be achieved by reducing the relative zone thicknesses as generally shown at 32 in FIG. 7B. Apodization of an amplitude Fresnel zone plate 34 may be achieved by reducing the duty cycle within each zone as shown at 34 in FIG. 7C. Apodization of mixed Fresnel zone plates may also be employed in accordance with further embodiments of the invention.

Figure 8:
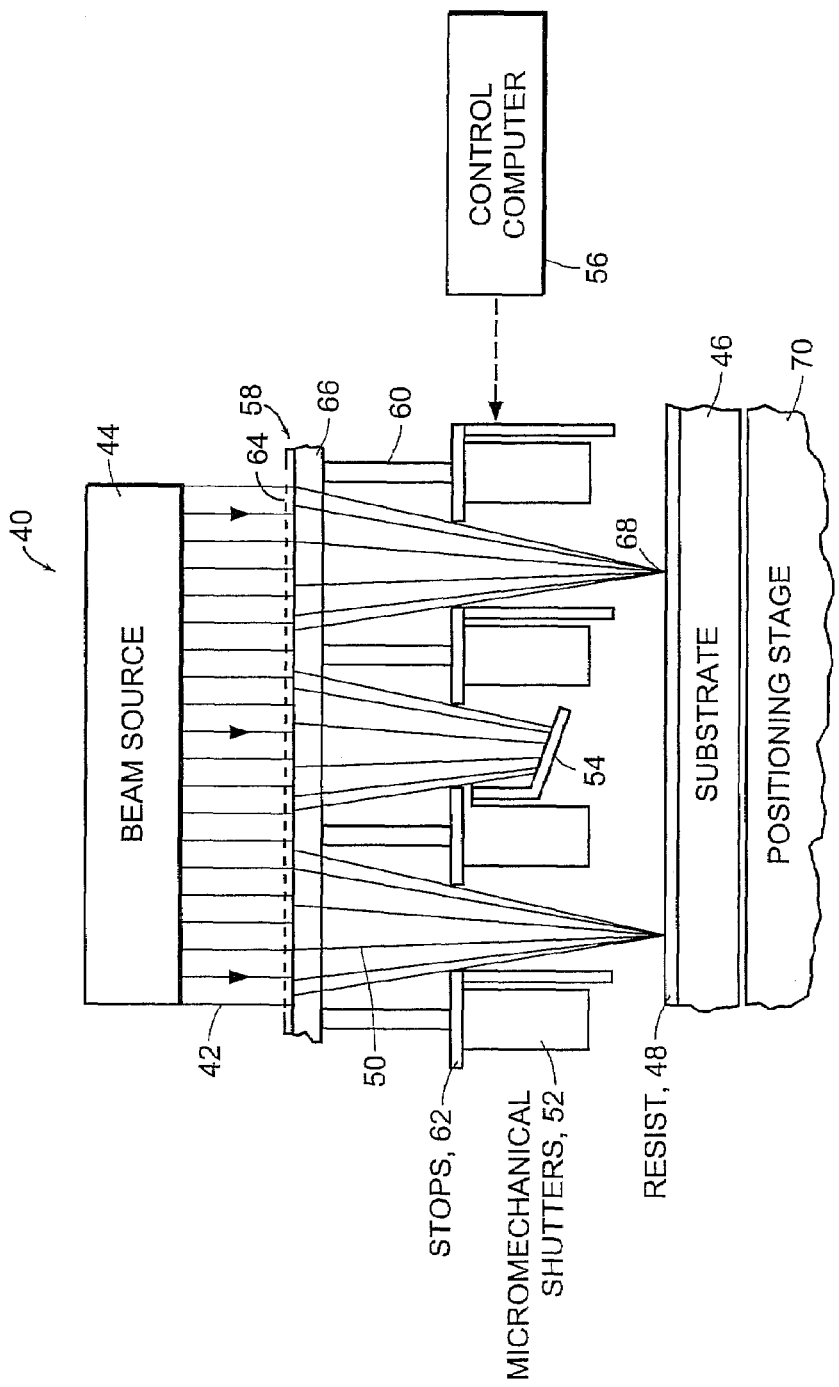
FIG. 8 shows an illustrative diagrammatic schematic view of an embodiment of a maskless lithography system including diffractive elements made in accordance with an embodiment of the invention.

The arrays of zone plates that may be formed in accordance with various embodiments of the invention may further be used, for example, in other lithography systems such as those disclosed in U.S. Pat. No. 5,900,637, the disclosure of which is hereby incorporated by reference. For example, the array of patterns may be used to provide an array of focusing elements in a lithography system as shown in FIG. 8 that includes a maskless lithography arrangement 40 in accordance with the invention illustrating the focusing of incident beam 42 from a beam source 44 onto a substrate 46 coated with a resist 48 as focused beamlets 50. The arrangement includes micro-mechanical shutter devices 52 with actuated shutters 54 that turn the focused beams on and off in response to commands from a control computer 56. The shutter devices 52 may be interposed between the zone-plate array 58, joists 60, stops 62, and the substrate 46. The second beam from the left is indicated as being in the off state.

As shown, each of the zone plates 64 on the membrane 66 of the array 58 is able to focus a collimated beam 42 to a fine focal spot 68 on the resist-coated substrate 46, which is supported on a positioning stage 70. To write a pattern, the substrate is scanned under the array, while the individual beamlets 50 are turned on and off as needed by means of the micromechanical shutters 52, one associated with each zone plate. These shutters may be located either between the zone plate array and the substrate, i.e., down-stream, as illustrated in FIG. 8, or between the zone plate array and the source of radiation, i.e., up-stream, as shown in FIG. 9.

Figure 9:
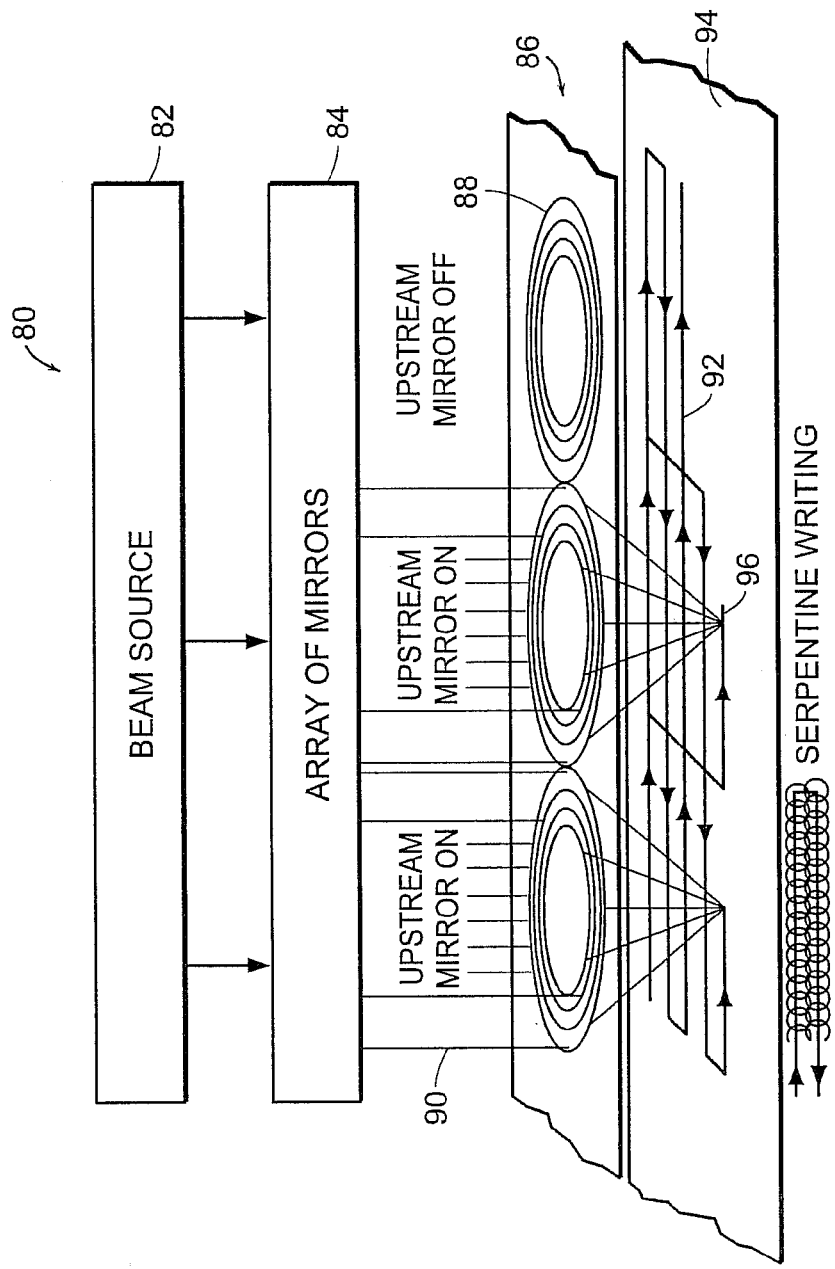
FIG. 9 shows an illustrative diagrammatic schematic view of another embodiment of a maskless lithography system including diffractive elements made in accordance with an embodiment of the invention.

FIG. 9 shows is an illustration of a possible writing scheme used in connection with an embodiment of a maskless lithography system 80. The arrangement includes a radiation source 82 and an array of upstream mirrors 84 that are positioned between an array 86 of diffractive elements 88. A serpentine writing scheme is depicted, with the substrate scanned in X and Y by a fast piezoelectric system (not shown), thereby filling in the full pattern. Radiation is readily reflected at glancing angles from a polished surface. Accordingly, an array of micromechanical, deflectable glancing-angle mirrors 84, located upstream, may be used to turn individual focused beams 90 on and off. Texas Instruments, Inc. of Dallas, Tex. has developed a visible-light projection display system that employs an array of deflectable micromechanical mirrors. The technology for fabricating and deflecting such micromechanical mirrors, therefore, is known in the art.

There are various strategies through which the scanning and writing may be achieved. One is to employ a square array of zone plates, with each zone plate writing only within its unit cell as discussed above. The scanning in this case would be serpentine, as depicted at 92 in FIG. 9, with the positioning stage and hence the substrate 94 moving only a distance equal to the unit cell edge dimension in X and Y until all pixels within the unit cell are addressed, and either written (i.e., shutter open) at a focal spot 96 or not (i.e., shutter closed). An alternative to a this step-and-scan strategy, is a linear-scan strategy similar to that described by M. Feldman, OSA Proceedings on Soft-X-ray Projection Lithography, Eds. A. M. Hawryluk and R. H. Stulen (Opt. Soc. Amer., Washington, D.C.) 18, 207 (1993), incorporated herein by reference. In Feldman's scheme, a close-packed array of zone plates would be azimuthally rotated relative to the scanning direction in such a way that all pixels can be addressed when the substrate is scanned along one direction only.

The focusing elements may be any of a variety of diffractive and/or refractive elements including those disclosed in U.S. patent application Ser. No. 10/624,316 filed Jul. 22, 2003, (the disclosure of which is hereby incorporated by reference), which claims priority to U.S. Provisional Applications Ser. Nos. 60/397,705 and 60/404,514, including, for example, amplitude and/or phase Fresnel zone plates, blazed zone plates, bessel zone plates, photon sieves (e.g., amplitude photon sieves, phase photon sieves, or alternating phase photon sieves), and the diffractive focusing elements may be apodized. These may be microfabricated in large arrays as well, and may be designed to compensate for wavefront characteristics in the radiation output from the source array to achieve, for example, the smallest possible focal spot.

An array of individually selectable switches may be employed to control the illumination from a single source or an array of individually selectable sources may be used, such as for example, semiconductor lasers, diode lasers, light emitting diodes, vertical cavity surface emitting lasers etc. as disclosed in U.S. patent application Ser. No. 10/628,809 filed Jul. 28, 2003 (the disclosure of which is hereby incorporated by reference), which claims priority to U.S. patent application Ser. No. 60/400,812.

Figure 10:
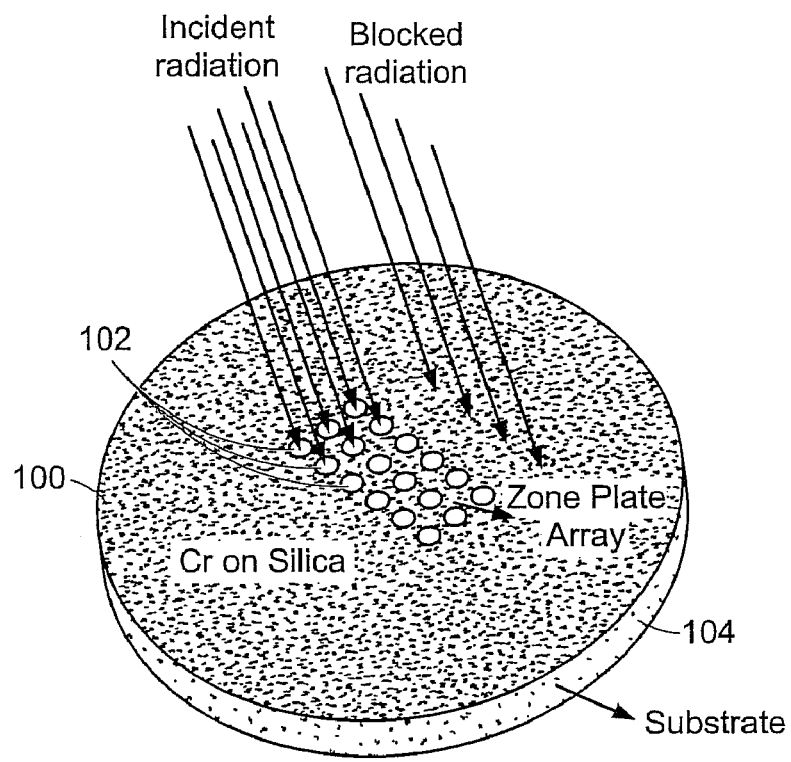
FIG. 10 shows an illustrative diagrammatic isometric view of a diffractive optical array in accordance with an embodiment of the invention with a layer of absorbing material surrounding the optics to prevent undesired radiation from reaching the substrate.
Figure 11:
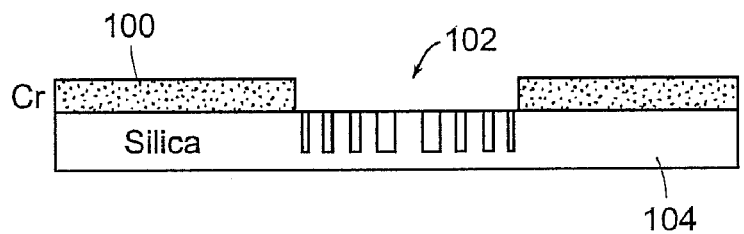
FIG. 11 shows an illustrative diagrammatic side view of a fused silica wafer with a phase zone plate etched into it.

In further embodiments, the invention also provides for the fabrication of arrays of diffractive optical elements using a method for self-aligned selective chemical etching (Brush-Fire-lithography). On the substrate containing the diffractive optics, it is often desirable to block all the incident radiation that is not going through the fabricated diffractive optics. This may be accomplished by means of an absorbing layer 100 surrounding the diffractive optics 102 such as a zone plate array on a substrate 104, as illustrated in FIGS. 10 and 11. It is apparent that in order to define the diffractive optic and create circles of an absorbing material precisely surrounding the optical elements, two lithography steps would conventionally be required. One lithography step would define the circles that would contain the diffractive optics. A second step, after proper alignment, would define the optics.

In certain embodiments, other processes of the invention may also avoid the need for a second lithography step while achieving perfect alignment between the absorber and the features of the diffractive optic. The solution arises from the realization that after patterning the diffractive optics, an evaporation of the absorber material onto the substrate can be performed, with the result that the absorber material (a metal in most cases) that lands in the trenches and on top of the features of the optics is not electrically connected to the metal area surrounding the diffractive elements. Rather that having to perform a second lithography step requiring nanometer level alignment so as to remove the absorber that is on the zones, the lack of electrical connectivity between the metal inside and outside the zone plates allows for the removal of either the inside metal or the outside one with one single high-resolution wet etch step.

The method that can be employed is called the Fulton/Dolan Process (also known as BrushFire Lithography) and was originally proposed by T. A. Fulton and G. J. Dolan from Bell Labs in 1983 for the fabrication of commercial photomasks. The Dolan process is a method for selectively controlled chemical etching and has been found to be suitable in certain applications of the present invention for the fabrication of zone plate arrays.

Figure 12A:
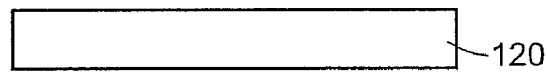
FIGS. 12A-12E show illustrative diagrammatic views of steps in a fabrication process in accordance with another embodiment of the invention using a self alignment process.
Figure 12B:
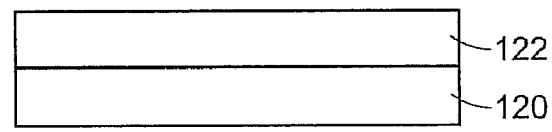
Figure 12C:
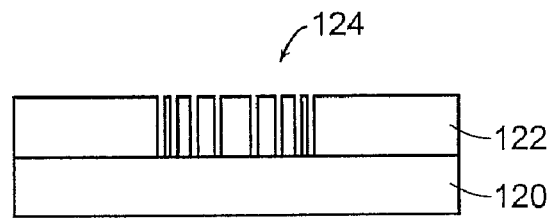
Figure 12D:
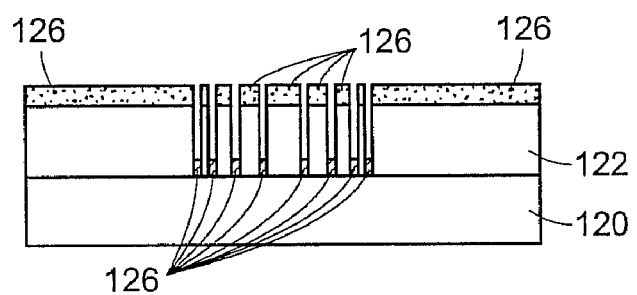
Figure 12E:
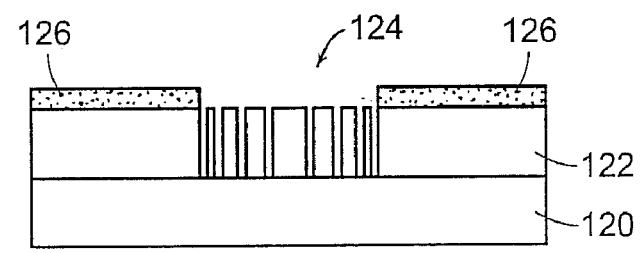
Figure 13:
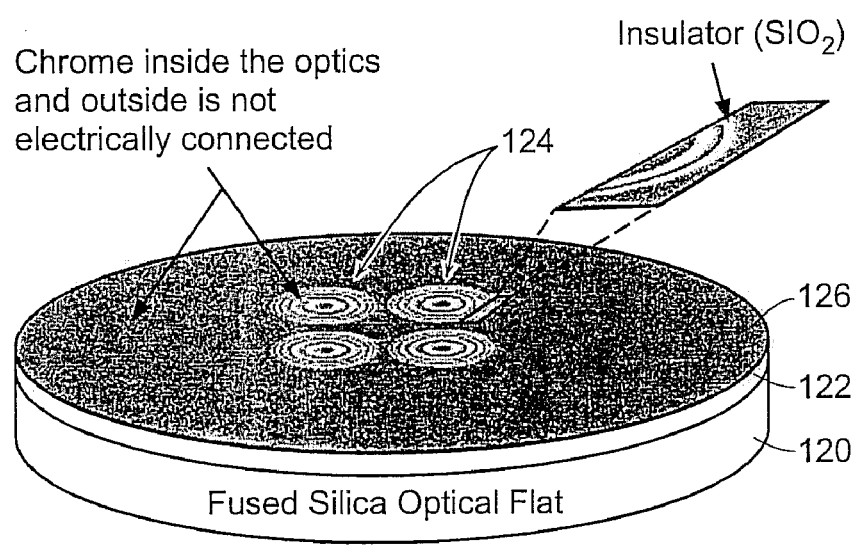
FIG. 13 shows an illustrative diagrammatic isometric view of an array of diffractive elements after the absorber has been evaporated.

As shown in FIGS. 12A and 12B, a fused silica substrate 120 (e.g., $SiO_2$) is provided on which HSQ 122 is spun to a desired thickness. The thickness of the HSQ, for example, may be chosen to provide an appropriate phase step for the diffractive optical element. The HSQ is then patterned to create the desired pattern as shown at 124 in FIG. 12C. After patterning the elements in HSQ, an absorber material 126 is then evaporated onto the HSQ as shown in FIG. 12D. The absorber material (e.g., chrome) is deposited not only on the top surfaces of the HSQ 122, but also in the inside the diffractive element between the rises in the pattern 124. As further shown in FIG. 13, because the absorber material that is outside of the pattern 124 is not in electrical contact with the absorber material within the diffractive element (both on top of and between each of the rises) the portion of the absorber material that is outside of the pattern may receive a small electric potential, from which the remaining absorber material will be isolated. All that is needed is a difference in electrical potential and this may be achieved by simply coupling copper leads to the portion of the absorber material that is outside of the pattern. This permits the portion of the absorber within the diffractive element to be removed by a wet etch technique that does not remove the portion of the absorber material that is charged with an electric potential (e.g., the portion outside the diffractive element). The result, as shown in FIG. 12E, is that the absorber material is precisely aligned with the diffractive element.

Figure 14A:
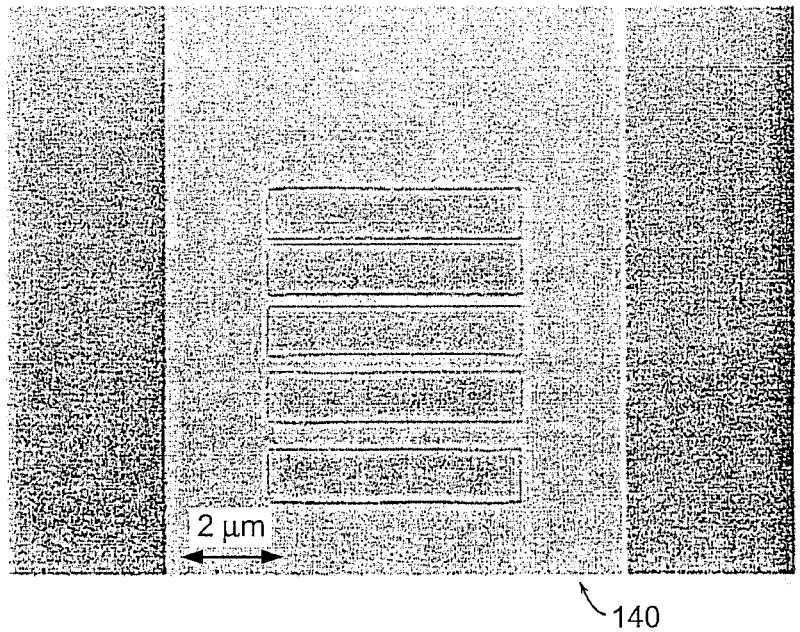
FIGS. 14A-14D show scanning electron micrographs demonstrating the high resolution of a process for forming arrays of diffractive elements in accordance with a further embodiment of the invention.
Figure 14B:
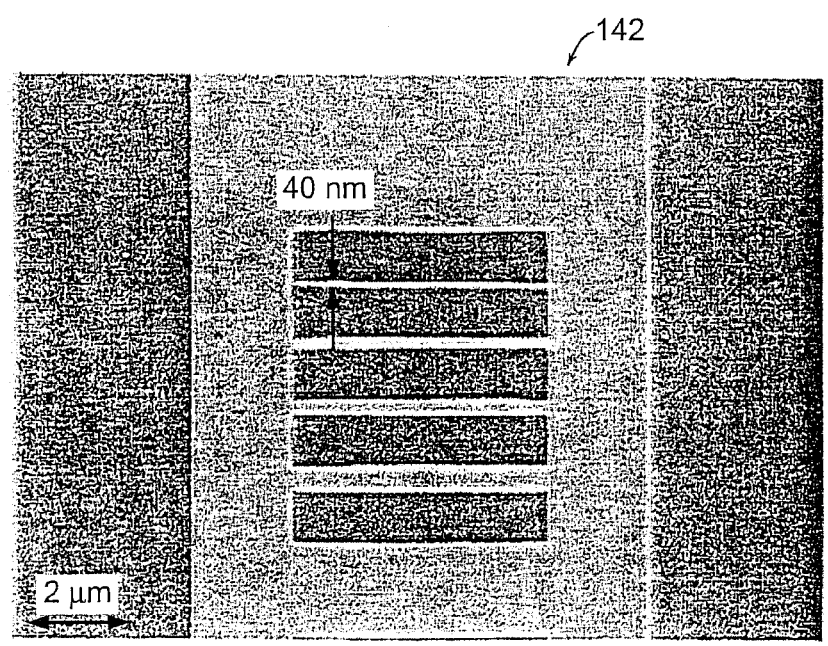
Figure 14C:
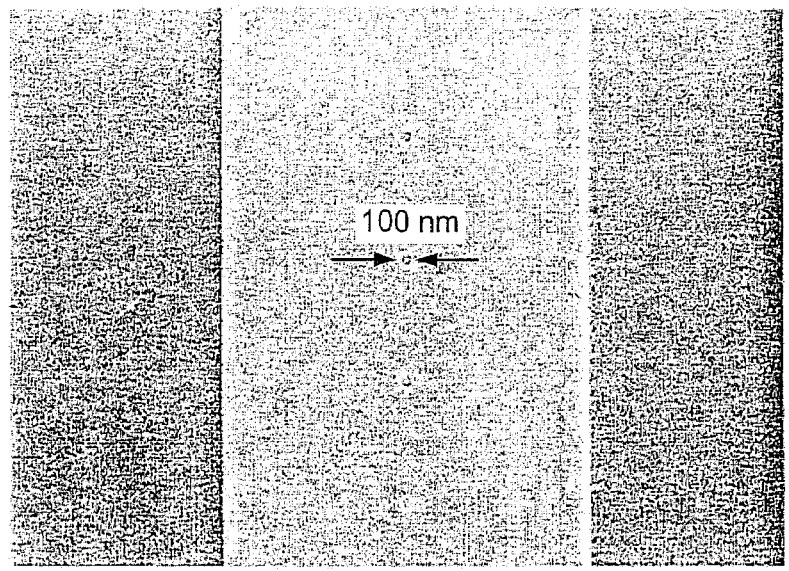
Figure 14D:
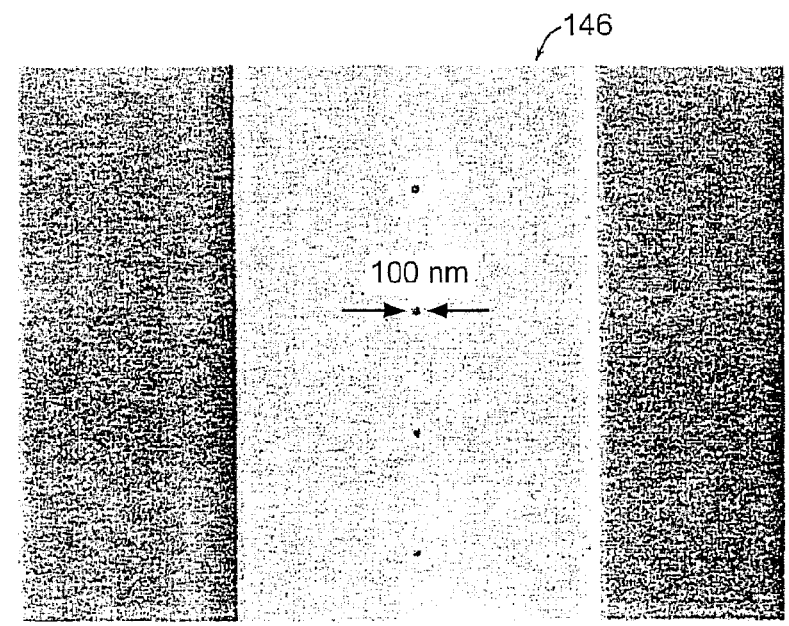

FIGS. 14A-14D demonstrates the high resolution of the above process that combines the use of the HSQ process with the charged wet etch technique discussed above. In particular, FIG. 14A shows an array of rectangular shaped elements 140 before the charged wet etching step, and FIG. 14B shows at 142 the same array of rectangular shaped elements after the charged wet etching process. FIG. 14C shows an array of small circular shaped elements 144 before the charged wet etching step, and FIG. 14D shows at 146 the same array of small circular shaped elements after the charged wet etching process.

Figure 15A:
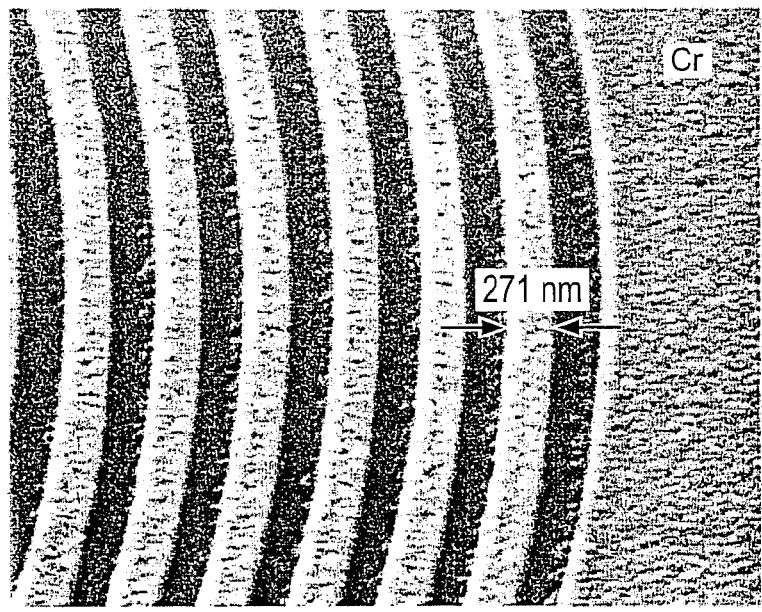
FIGS. 15A and 15B show arrays of diffractive elements formed in accordance with a another embodiment of the invention involving a self alignment process.
Figure 15B:
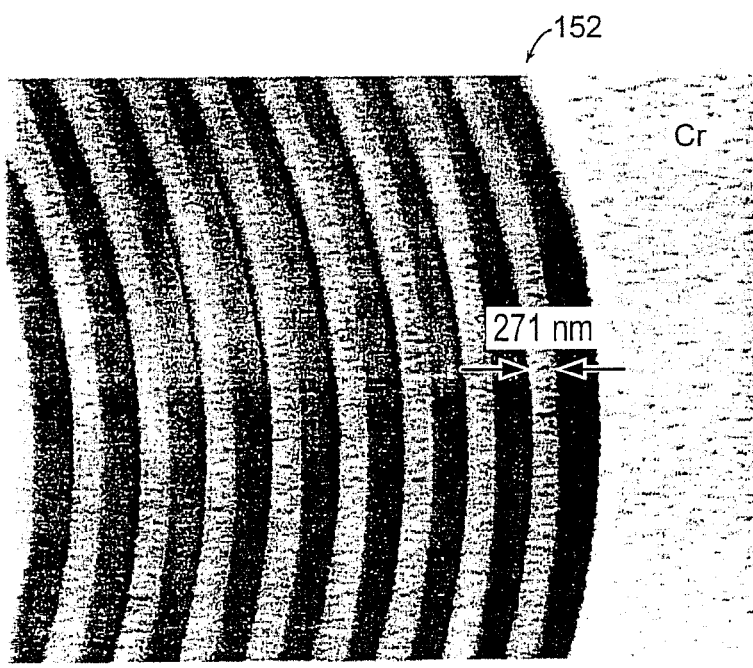

FIG. 15A shows a scanning electron micrograph of a fabricated diffractive optical element 150 (a zone plate in this case) before the charged wet etching process was applied, and FIG. 15B shows at 152 a scanning electron micrograph of the same fabricated diffractive optical element after the charged wet etching process was applied. As may be seen, perfect alignment may be achieved between the surrounding absorber and the last zone of the zone plate.

Those skilled in the art will appreciate that numerous modifications and variations may be made to the above disclosed embodiments without departing from the spirit and scope of the invention.

What is claimed is:

1. A method of forming an array of focusing elements for use in a lithography system, said method comprising the steps of:
    providing a substrate;
    conducting maskless lithography on said substrate at a first location using a first lithographic technique and a first set of exposure characteristics to form a first resist area;
    depositing a conductive absorber material on the substrate;
    applying an electrical potential to at least a first portion of the conductive absorber material such that a second disconnected portion of the conductive material has a different electrical potential; and
    etching said second portion of said conductive material to provide a first pattern on said substrate.

2. The method as claimed in claim 1, wherein said substrate is formed of hydrogen silsesquioxane.

3. The method as claimed in claim 1, wherein said first lithographic technique involves the use of electron beam lithography.

4. The method as claimed in claim 1, wherein said first lithographic technique involves the use of x-ray lithography.

5. The method as claimed in claim 1, wherein said first resist area includes $SiO_2$.

6. The method as claimed in claim 1, wherein said first resist area is transparent.

7. The method as claimed in claim 1, wherein said first resist area forms at least part of a Fresnel zone plate.

8. The method as claimed in claim 1, wherein said first resist area forms at least part of a blazed zone plate.

9. The method as claimed in claim 1, wherein first resist area forms at least part of an apodized zone plate.

10. A method of forming an array of focusing elements for use in a maskless lithography system, said method comprising the steps of:
    providing a substrate including hydrogen silsesquioxane,
    providing a first pattern via maskless lithography in said substrate, said first pattern including focusing elements for said maskless lithography systems,
    depositing a conductive absorber material on said substrate,
    applying an electrical potential to at least a first portion of said conductive absorber material leaving a second portion of said conductive material with a different electrical potential, and
    etching said second portion of said conductive material to provide a first pattern on said substrate that is aligned with said first portion of said conductive absorber.

11. The method as claimed in claim 10, wherein said step of providing a first pattern via lithography in said substrate involves the use of at least one of electron beam lithography or x-ray lithography.

12. The method as claimed in claim 10, wherein said first pattern provides at least one blazed focusing element.

13. A method of forming an array of focusing elements for use in a lithography system, said method comprising the steps of:
    providing a first pattern via lithography in a substrate;
    depositing a conductive absorber material on said substrate;
    applying an electrical potential to at least a first portion of said conductive absorber material, leaving a second portion of said conductive material with a different electrical potential; and
    etching said second portion of said conductive material to provide a first pattern on said substrate that is aligned with said first portion of said conductive absorber material.

14. The method as claimed in claim 13, wherein said substrate is formed of hydrogen silsesquioxane.

15. The method as claimed in claim 13, wherein said step of providing a first pattern via at least one of electron beam lithography or x-ray lithography.

16. The method as claimed in claim 13, wherein said conductive absorber material is chromium.

17. The method as claimed in claim 13, wherein said first pattern includes an array of optical elements.

18. The method as claimed in claim 13, wherein said first pattern includes an array of blazed zone plates.

19. A method of forming an array of focusing elements for use in a lithography system, said method comprising the steps of:
    providing a first pattern via lithography in a substrate including hydrogen silsesquioxane;
    depositing a conductive absorber material on said substrate;
    applying an electrical potential to at least a first electrically continuous portion of said conductive absorber material, leaving a second electrically discontinuous portion of said conductive material with a different electrical potential; and
    wet etching said second portion of said conductive material to provide a first pattern on said substrate that is aligned with said first portion of said conductive absorber material, said first pattern including an array of focusing elements for the lithography system.

20. The method as claimed in claim 19, wherein said step of providing said first pattern on said substrate involves electron beam lithography.

* * * * *